United States Patent
Kim et al.

(12) United States Patent     (10) Patent No.: US 8,593,173 B2
Kim et al.     (45) Date of Patent: Nov. 26, 2013

(54) PROGRAMMABLE LOGIC SENSING IN MAGNETIC RANDOM ACCESS MEMORY

(75) Inventors: Jung Pill Kim, San Diego, CA (US);
Tae Hyun Kim, San Diego, CA (US);
Wenqing Wu, San Diego, CA (US);
Xiaochun Zhu, San Diego, CA (US);
Seung H. Kang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 69 days.

(21) Appl. No.: 13/244,962

(22) Filed: Sep. 26, 2011

(65) Prior Publication Data

US 2013/0076390 A1    Mar. 28, 2013

(51) Int. Cl.
*H03K 19/177* (2006.01)

(52) U.S. Cl.
USPC .................................. 326/39; 326/41; 326/47

(58) Field of Classification Search
USPC ................................................ 326/38, 40, 41
See application file for complete search history.

(56) References Cited

U.S. PATENT DOCUMENTS

| | | | |
|---|---|---|---|
| 6,760,251 B2 | 7/2004 | Hidaka | |
| 6,839,272 B2 | 1/2005 | Ooishi | |
| 6,903,965 B2 | 6/2005 | Ishikawa | |
| 8,373,438 B2* | 2/2013 | Shukh | 326/37 |
| 2008/0285360 A1 | 11/2008 | Sakimura et al. | |
| 2009/0073750 A1 | 3/2009 | Leuschner | |
| 2009/0201717 A1* | 8/2009 | Maeda et al. | 365/148 |
| 2010/0039136 A1* | 2/2010 | Chua-Eoan et al. | 326/38 |
| 2010/0103730 A1* | 4/2010 | Shin | 365/173 |
| 2011/0292718 A1* | 12/2011 | Suzuki et al. | 365/158 |

OTHER PUBLICATIONS

International Search Report and Written Opinion—PCT/US2012/057310—ISA/EPO—Feb. 5, 2013.
Zhao, et al. "Integration of Spin-RAM Technology in FPGA Circuits," 8th International Conference of Solid-State and Integrated Circuit Technology, 2006, ICSICT 06, Oct. 2006, pp. 799-802.

* cited by examiner

*Primary Examiner* — Jason M Crawford
(74) *Attorney, Agent, or Firm* — Sam Talpalatsky; Nicholas J. Pauley; Joseph Augsta

(57) ABSTRACT

A Magnetic Random Access Memory (MRAM) logic circuit includes read sensing circuitry having a first level corresponding to a first category of logic circuitry and a second logic level corresponding to a second category of logic circuitry. The logic circuitry may be switchable between circuitry having the first logic level and circuitry having the second logic level according to the category of the logic circuit being implemented.

17 Claims, 7 Drawing Sheets

| Topology of MRAM cells | | | | | Logic |
|---|---|---|---|---|---|
| Eval | A | ~A | B | ~B | |
| 0 | 0 | 1 | 0 | 1 | OR |
| 0 | 1 | 0 | 1 | 0 | NAND |
| 1 | 0 | 1 | 0 | 1 | AND |
| 1 | 1 | 0 | 1 | 0 | NOR |

FIG. 2
PRIOR ART

| input | A,B | | | | reference |
|---|---|---|---|---|---|
| | 0,0 | 0,1 | 1,0 | 1,1 | |
| OR | Rp‖Rp | Rp‖Rap | Rp‖Rap | Rap‖Rap | (Rp‖Rp) ‖ (Rp‖Rap) |
| NAND | Rap‖Rap | Rp‖Rap | Rp‖Rap | Rp‖Rp | (Rp‖Rp) ‖ (Rp‖Rap) |
| AND | Rp‖Rp | Rp‖Rap | Rp‖Rap | Rap‖Rap | (Rap‖Rap) ‖ (Rp‖Rap) |
| NOR | Rap‖Rap | Rp‖Rap | Rp‖Rap | Rp‖Rp | (Rap‖Rap) ‖ (Rp‖Rap) |

PROGRAMMABLE LOGIC SENSING IN MAGNETIC RANDOM ACCESS MEMORY

TECHNICAL FIELD

The present disclosure generally relates to Magnetic Tunnel Junction (MTJ) devices. More specifically, the present disclosure relates to programmable logic gate implementation with MTJs.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnitization direction that can be altered to represent either a "1" when the free layer magnetization is anti-parallel to the fixed layer magnitization or "0" when the free layer magnetizaiton is parallel to the fixed layer magnitization or vice versa. One such device having a fixed layer, a tunneling layer, and a free layer is a magnetic tunnel junction (MTJ). The electrical resistance of an MTJ depends on whether the free layer magnitization and fixed layer magnitization are parallall or antiparallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic "0" and a logic "1" value stored by the MTJ.

Bitcells of a magnetic random access memory may be arranged in one or more arrays including a pattern of memory elements (e.g., MTJs in case of MRAM). STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

BRIEF SUMMARY

Aspects of the present disclosure provide a programmable logic circuit including magnetic tunnel junctions (MTJs) that are configurable as logic circuitry. The logic circuitry includes a first category of logic gates and a second category of logic gates. The programmable logic circuit also includes reference circuitry that is configurable to select a first reference level for the first category of logic gates and a second reference level for the second category of logic gates.

Another aspect of the present disclosure provides a method of magnetic random access memory (MRAM) logic sensing. The method includes coupling an output node of an MRAM logic gate to a reference node of a reference circuit of the MRAM. The MRAM logic gate is in one of at least two categories of logic gates. The method also includes configuring the reference circuit to provide one of at least two gate's reference levels corresponding to the MRAM logic gate's category.

Another aspect of the present disclosure provides a method of magnetic random access memory (MRAM) logic sensing. The method includes the step of coupling an output node of an MRAM logic gate to a reference node of a reference circuit of the MRAM. The MRAM logic gate is in one of at least two categories of logic gates. The method also includes the step of configuring the reference circuit to provide one of at least two reference levels corresponding to the MRAM logic gate's category.

Another aspect of the present disclosure provides an apparatus for magnetic random access memory (MRAM) logic sensing. The apparatus includes means for coupling an output node of an MRAM logic gate to a reference node of a reference circuit of the MRAM. The MRAM logic gate is in one of at least two categories of logic gates. The apparatus also includes means for configuring the reference circuit to provide one of at least two reference levels corresponding to the MRAM logic gate's category.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 2 is a table showing logic levels of MTJs for programming the programmable logic gate circuitry shown in FIG. 1.

DETAILED DESCRIPTION

Various combinations of MTJs may be configured as various types of logic gates. The configurations are enabled by setting the MTJs in a particular state (parallel or anti-parallel) with a write current in the same manner as the write current would be applied in a write operation of the MRAM circuitry.

Figure 1:
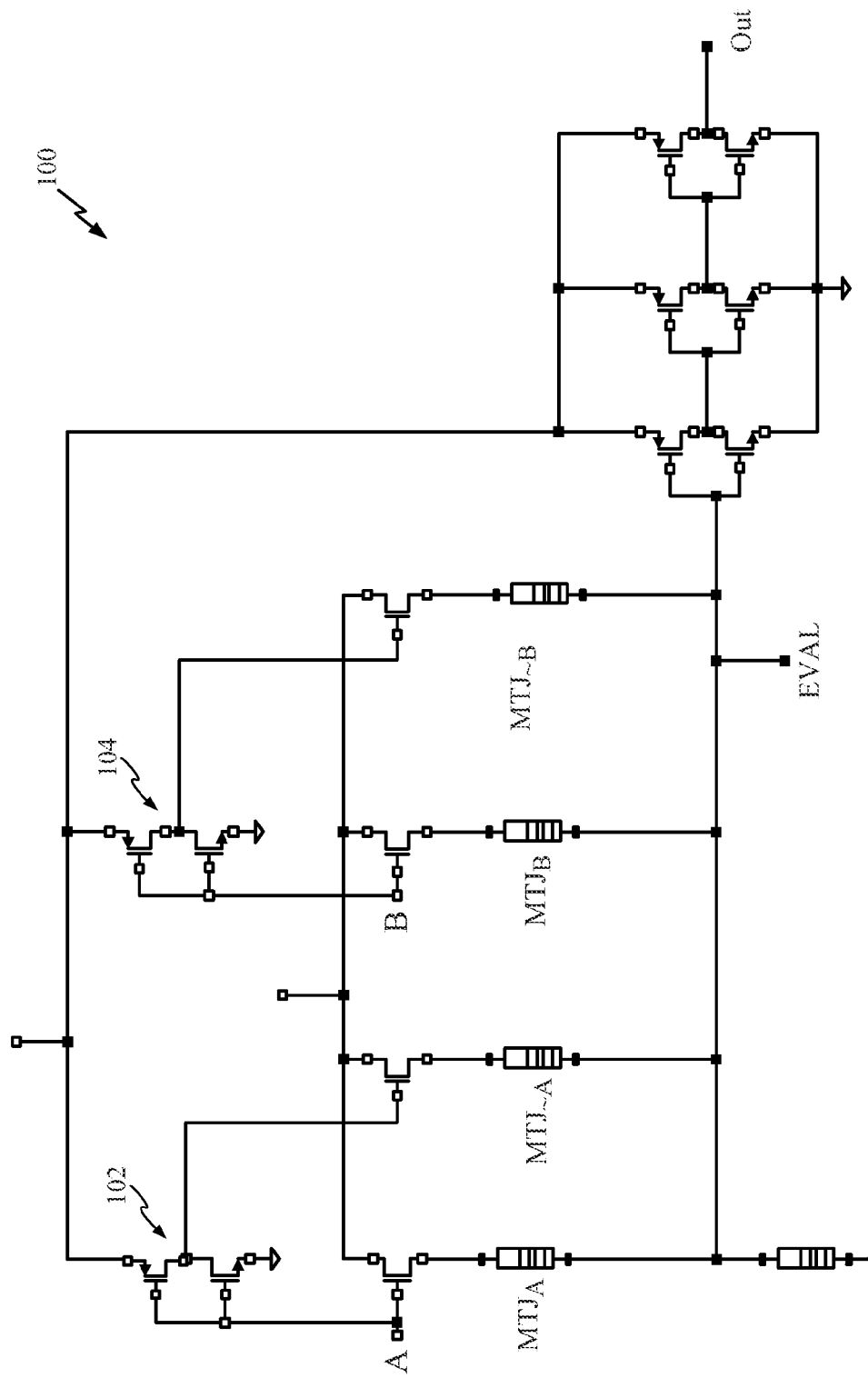
FIG. 1 is a circuit schematic illustrating a known programmable logic gate implementation using MTJs.

Conventional logic gates that can be implemented using STT-MRAM are described with reference to FIG. 1 AND FIG. 2. Circuitry 100 includes four MTJs (MTJA, MTJ~A, MTJB and MTJ~B) arranged in parallel to implement a programmable two-input logic gate. Transistors 102 are configured as a first inverter between MTJA and MTJ~A so that inputs to MTJA and MTJ~A have opposite logic levels. Transistors 104 are configured as a second inverter between MTJB and MTJ~B so that inputs to MTJB and MTJ~B have opposite logic levels. The circuitry 100 may be preprogrammed to function as an OR gate, a NAND gate, an AND gate or a NOR gate by performing a write operation to pre-program each of the four MTJs.

The type of gate implemented in the circuitry 100 depends on the pre-programmed state of each of the four MTJs and the logic level of a node labeled "EVAL" as shown in FIG. 2. For example, by performing a write operation on MTJA and MTJB which sets the state of MTJA and MTJB to a logic level '0' (i.e., having resistance Rp) which also sets MTJ~A and MTJ~B to a logic level '1' (i.e., having resistance Rap) and setting the EVAL node to a logic level '0' the circuitry 100 is configured as an OR gate. Similarly, by performing a write operation on MTJA and MTJB which sets the state of MTJA and MTJB to a logic level '0' which also sets MTJ~A and MTJ~B to a logic level '1' and setting the EVAL node to a logic level '1' the circuitry 100 is configured as an AND gate.

Also, by performing a write operation on MTJA and MTJB which sets the state of MTJA and MTJB to a logic level '1' (i.e., having resistance Rap) which also sets MTJ~A and MTJ~B to a logic level '0' (i.e., having resistance Rp) and setting the EVAL node to a logic level '0' the circuitry 100 is configured as a NAND gate. Similarly, by performing a write operation on MTJA and MTJB which sets the state of MTJA and MTJB to a logic level '1' which also sets MTJ~A and MTJ~B to a logic level '0' and setting the EVAL node to a logic level '1' the circuitry 100 is configured as a NOR gate.

After the four MTJs (MTJA, MTJ~A, MTJB and MTJ~B) have been preprogrammed, the resulting logic gate is evaluated by performing a read operation that applies a read current to input nodes where a logic level '1' is to be asserted, and by applying an appropriate logic level signal to the EVAL node.

The output of the programmed logic gate is then represented by the combined resistance of the four parallel MTJs. This functionality is explained in more detail below with reference to FIG. 1, FIG. 2 and FIG. 4.

Consider an example in which circuitry 100 has been pre-programmed to function as an OR gate. If input A (applied to MTJA) and input B (applied to MTJB) are at logic level '0' then no read current is applied to MTJA or MTJB. However, the inverter transistors 102, 104 cause a read current to be applied to MTJ~A and MTJ~B. The effective resistance of the four MTJs (of which only two are measured by read currents) is the combined resistance of MTJ~A in parallel with the resistance of MTJ~B. As shown in FIG. 2, this effective resistance corresponds to Rp in parallel with Rp. (See FIG. 2 in which Rp is represented by '1'). Because both inputs of the configured OR gate are at logic level '0' the effective resistance "Rp∥Rp" should be interpreted as a logical '0' output.

Figures 4, 5:
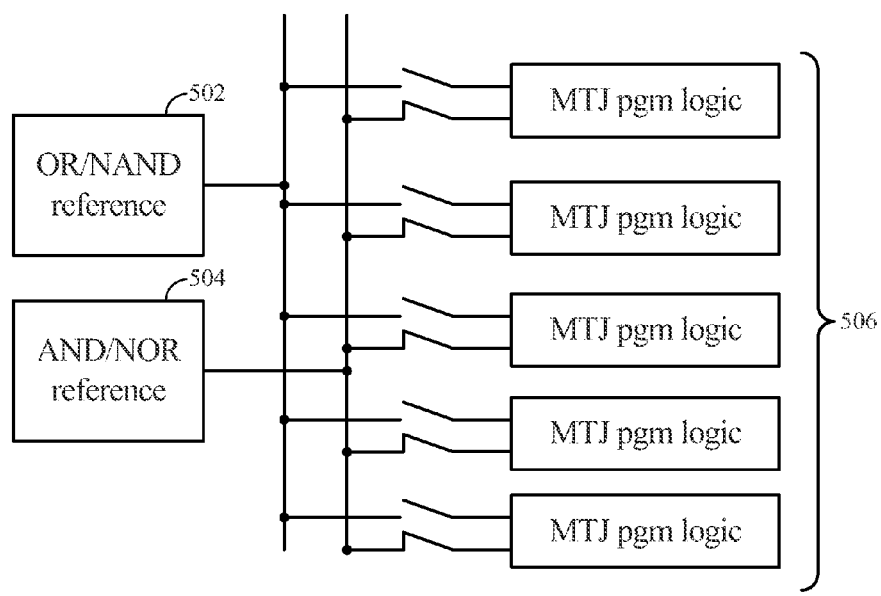
FIG. 4 is table showing effective resistance of MTJ logic gates for combinations of input logic levels, juxtaposed with corresponding output logic levels to be provided by the logic gates and showing a reference circuit resistance for evaluating the corresponding logic gates according to aspects of the present disclosure.
FIG. 5 is a circuit schematic showing shared reference circuits selectable by a number of different MTJ logic gates according to aspects of the present disclosure.

Referring to FIG. 4, the other possible input conditions to the OR gate, ([0,1], [1,0], [1,1]) should output a logical '1'. Application of read currents corresponding to these other possible inputs in the OR gate configuration of circuitry 100 applies read currents to MTJ combined resistances [Rp∥Rap], [Rp∥Rap] and [Rap∥Rap] respectively. Thus in the OR gate configuration, OR gate functionality [Rp∥Rap] and [Rp∥Rap] should be interpreted as a logical '1'. Therefore, according to aspects of the present disclosure, the output of the OR gate can be properly interpreted by comparison against a reference resistance that is about midway between the resistance of [Rp∥Rp] (logical '0') and the resistance of [Rp∥Rap] (logical '1'). It should be understood that the same midpoint resistance would also allow distinction between an [Rp∥Rp] (logical '0') output and output [Rap∥Rap] (logical '1') of the OR gate.

Figure 3:
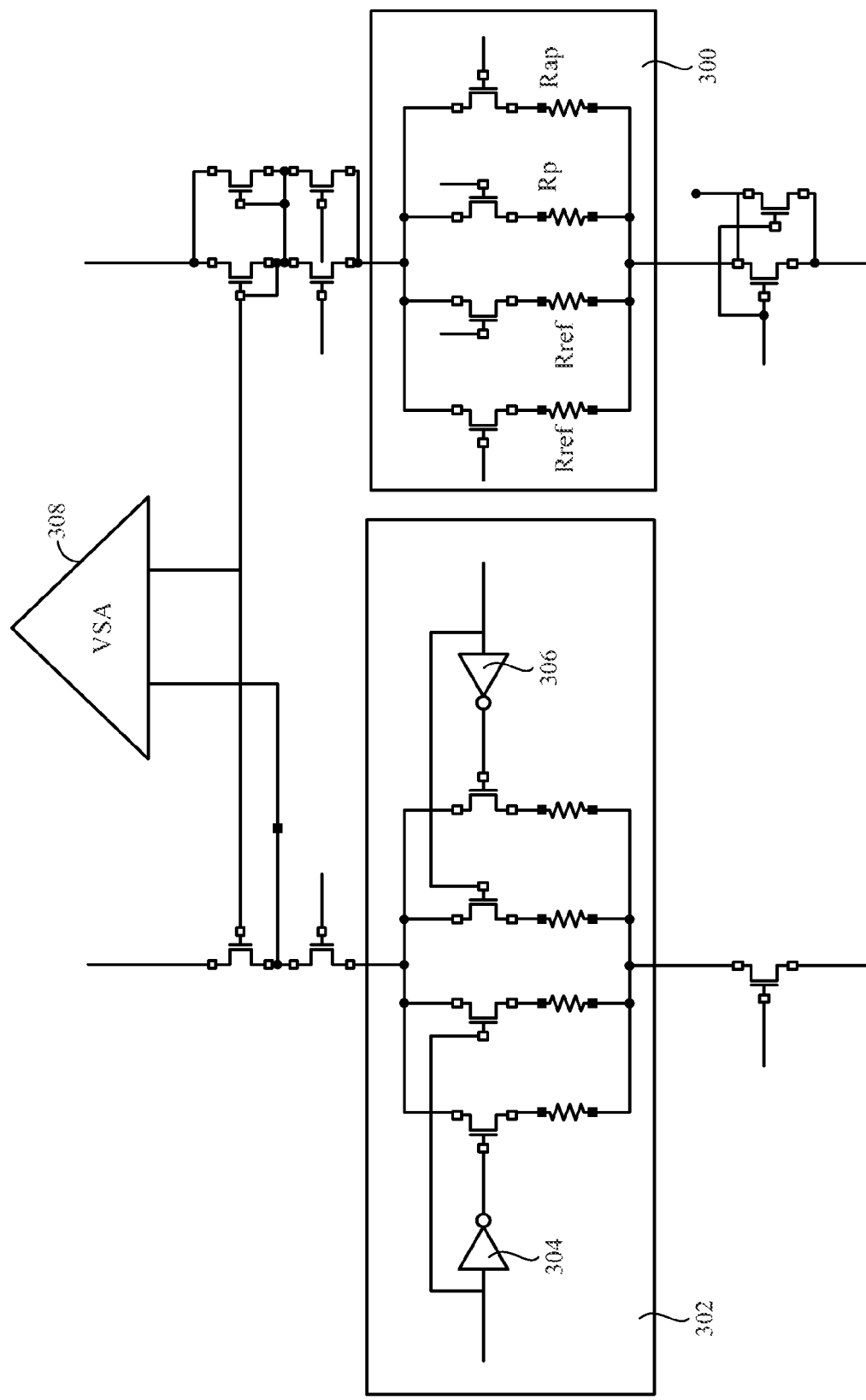
FIG. 3 is a circuit schematic illustrating a programmable logic gate implementation using MTJs including reference circuitry for evaluating a programmable logic gate according to aspects of the present disclosure.

Referring to FIG. 4, according to aspects of the present disclosure, a reference resistance midway between [Rp∥Rp] and [Rp∥Rap] can be implemented by providing the reference circuit resistance of [Rp∥Rp]∥[Rp∥Rap]. Referring to FIG. 3, this can be implemented in reference circuitry 300 in which a resistor Rref is configured with a value of Rp.

Thus far in the example, no structural difference between the OR gate configuration of circuitry 100 and an AND gate configuration of circuitry 100 have been described. However, referring to FIG. 4, the output for an AND gate configuration of circuitry 100 should be interpreted as logical '0' when the combined parallel resistance of MTJA, MTJ~A, MTJB and MTJ~B is either [Rp∥Rp] or [Rp∥Rap]. The output for the AND gate configuration of circuitry 100 should be interpreted as logical '1' when the combined parallel resistance of MTJA, MTJ~A, MTJB and MTJ·B is either [Rap∥Rap]. Therefore, according to aspects of the present disclosure, the output of the AND gate can be properly interpreted by comparison against a reference resistance that is about midway between the resistance of [Rp∥Rap] (logical '0') and the resistance of [Rap∥Rap] (logical '1'). It should be understood that the same midpoint resistance would also allow distinction between an [Rp∥Rp] (logical '0') output and output [Rap∥Rap] (logical '1') of the AND gate.

Referring to FIG. 4, according to aspects of the present disclosure, a reference resistance midway between [Rp∥Rap] and [Rap∥Rap] can be implemented by providing the reference circuit resistance of [Rp∥Rap]∥[Rap∥Rap]. Referring to FIG. 3, this can be implemented in reference circuitry 300 in which a resistor Rref is configured with a value of Rap. FIG. 3, shows circuitry 302 which corresponds to the circuitry 100 shown in FIG. 2 in which inverters 304 and 306 shown in FIG. 3 correspond to the transistors 102 and 104 shown in FIG. 2.

A voltage sense amplifier 308 is used to compare the output of circuitry 302 with reference circuitry 300.

According to aspects of the present disclosure, the difference between an OR gate configuration and an AND gate configuration of the circuitry 100 is determined by the logic level of a signal on the EVAL node. Also, referring to FIG. 2 and FIG. 4, according to aspects of the present disclosure, the difference between a NAND gate configuration and a NOR gate configuration of the circuitry 100 is determined by the logic level of a signal on the EVAL node.

Appropriate reference circuit resistances for use with each type of logic gate according to aspects of the present disclosure are summarized in FIG. 4. A reference circuit resistance corresponding to the parallel combination [Rp||Rp]||[Rp||Rap] should be used for evaluating the output of an OR gate configuration and for evaluating the output of a NAND gate configuration of circuitry 100, i.e., when a logic '0' signal is applied to the EVAL node. This reference circuit resistance is provided when the value of Rref as shown in FIG. 3 is set to Rp.

According to aspects of the present disclosure, a reference circuit resistance corresponding to the parallel combination [Rap||Rap]||[Rp||Rap] should be used for evaluating the output of an AND gate configuration and for evaluating the output of a NOR gate configuration of circuitry 100, i.e. when a logic '0' signal is applied to the EVAL node. This reference circuit resistance is provided when the value of Rref is set to Rp in FIG. 3.

According to aspects of the present disclosure, a reference circuit is provided for evaluating the state of MTJ logic circuitry. The reference circuitry provides a first effective resistance when being used for evaluating a first category of MTJ logic circuitry and a second effective resistance when for evaluating a second category of MTJ logic circuitry. In an illustrative embodiment, the first category of MTJ logic circuitry include OR gates and NAND gates and the first effective resistance is about [Rp||Rp]||[Rp||Rap]. In the illustrative embodiment, the second category of MTJ logic include AND gates and NOR gates and the second effective resistance is [Rap||Rap]||[Rp||Rap]. In the illustrative embodiment, the first category of logic gates correspond to application of a logical '0' EVAL signal and the second category of logic gates correspond to application of a logical '1' EVAL signal.

Referring to FIG. 3, according to one aspect of the present disclosure, reference circuitry having an effective resistance of [Rref||Ref]||[Rp||Rap] can be used to implement either the first effective resistance or the second effective resistance by setting the value of Rref to either Rp or Rap respectively. In an illustrative configuration, Rref is set to the value of Rp when the EVAL signal is logical '0' and Rref is set to the value of Rap when the EVAL signal is logical '1'. This may be implemented by configuring a switch controlled by the EVAL signal to switch reference MTJs having a selected Rp or Rap state in place of each instance of Rref, for example. In another example, the appropriate value of Rref may be implemented in a write operation by setting an appropriate state (Rp or Rap) of the reference MTJs in place of each instance of Rref.

Referring to FIG. 5, according to aspects of the present disclosure, a first reference circuit 502 and a second reference circuit 504 may be shared between a number of different programmable MTJ logic gates 506. MTJ logic gates 506 that are configured as OR gates and NAND gates may be coupled to the first reference circuit, and MTJ logic gates 506 that are configured as AND gates and NOR gates may be coupled to the second reference circuit. In an illustrative embodiment, the first reference circuit has an effective resistance of about [Rp||Rp]||[Rp||Rap] and the second reference circuit has an effective resistance of about [Rap||Rap]||[Rp||Rap].

Figure 6:
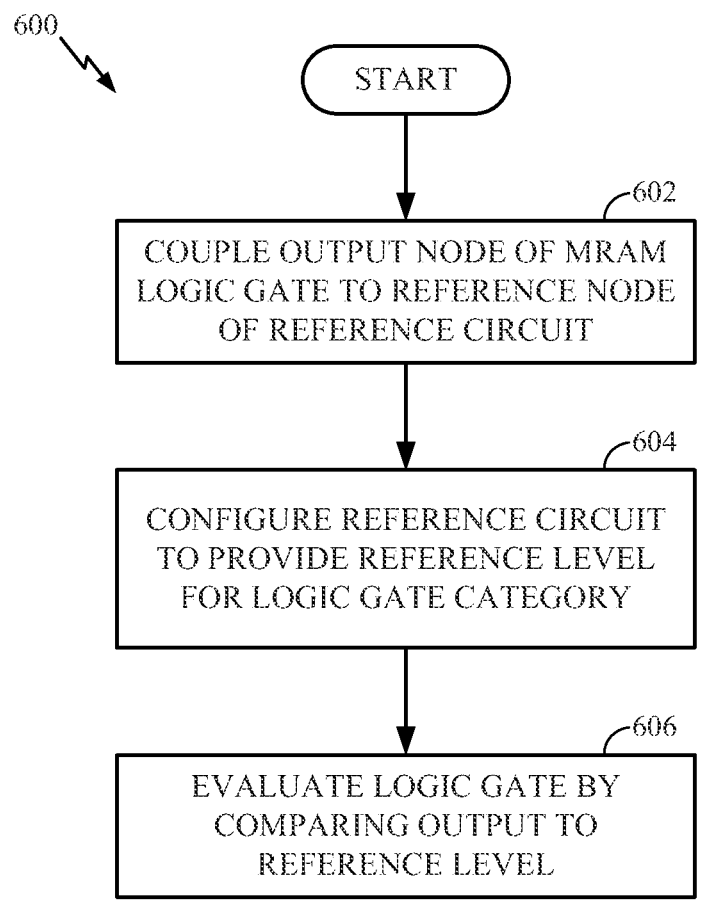
FIG. 6 is process flow diagram illustrating a method of MRAM logic sensing according to an aspect of the present disclosure.

A method 600 of MRAM logic sensing according to an aspect of the present disclosure is described with reference to FIG. 6. At block 602, the method includes coupling an output node of an MRAM logic gate to a reference node of a reference circuit of the MRAM. At block 604, the reference circuit is configured to provide a reference level corresponding to a logic gate category of the MRAM logic gate. At block 606, an output of the MRAM logic gate is evaluated by comparing an output level of the MRAM logic gate the configured reference level.

Figure 7:
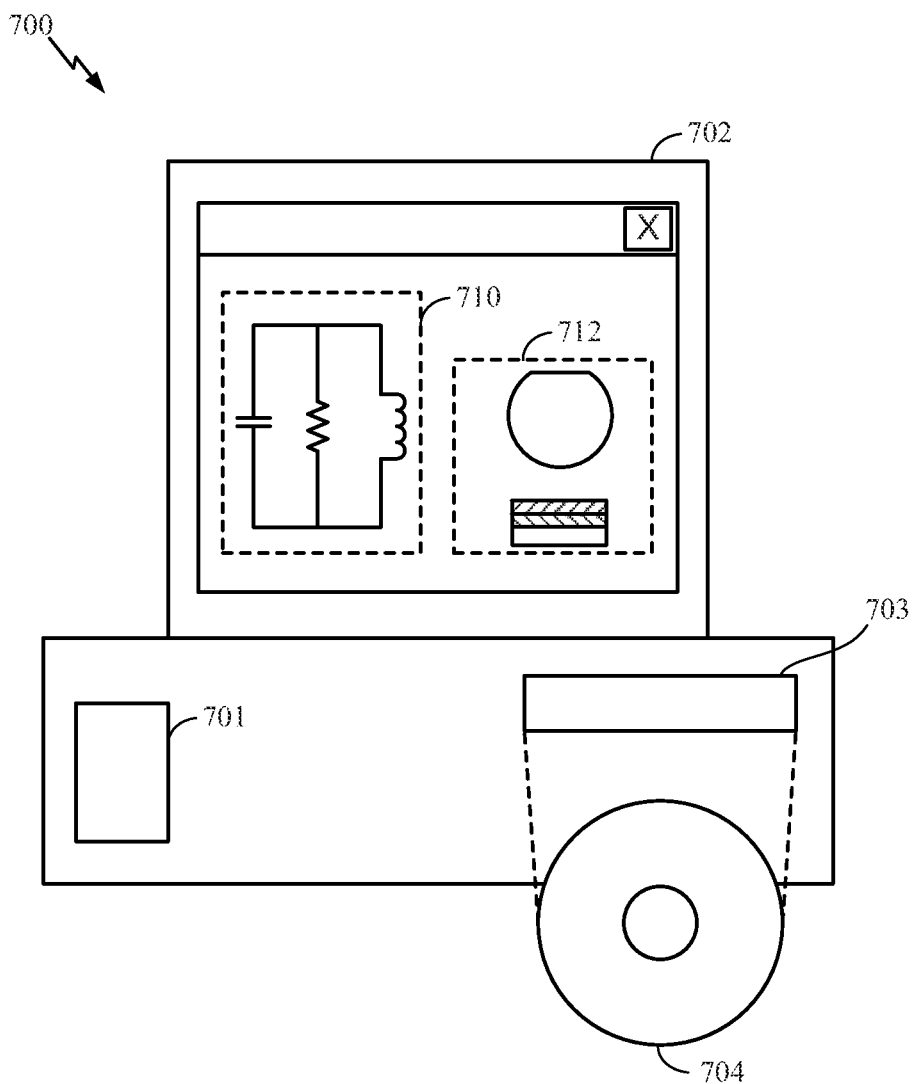
FIG. 7 is a block diagram illustrating a design workstation used for circuit, layout, and logic design of a semiconductor component according to one aspect.

FIG. 7 is a block diagram illustrating a design workstation used for circuit, layout, and logic design of a semiconductor component, such as the MRAM disclosed above. A design workstation 700 includes a hard disk 701 containing operating system software, support files, and design software such as Cadence or OrCAD. The design workstation 700 also includes a display to facilitate design of a circuit 710 or a semiconductor component 712 such as an MRAM. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

Figure 8:
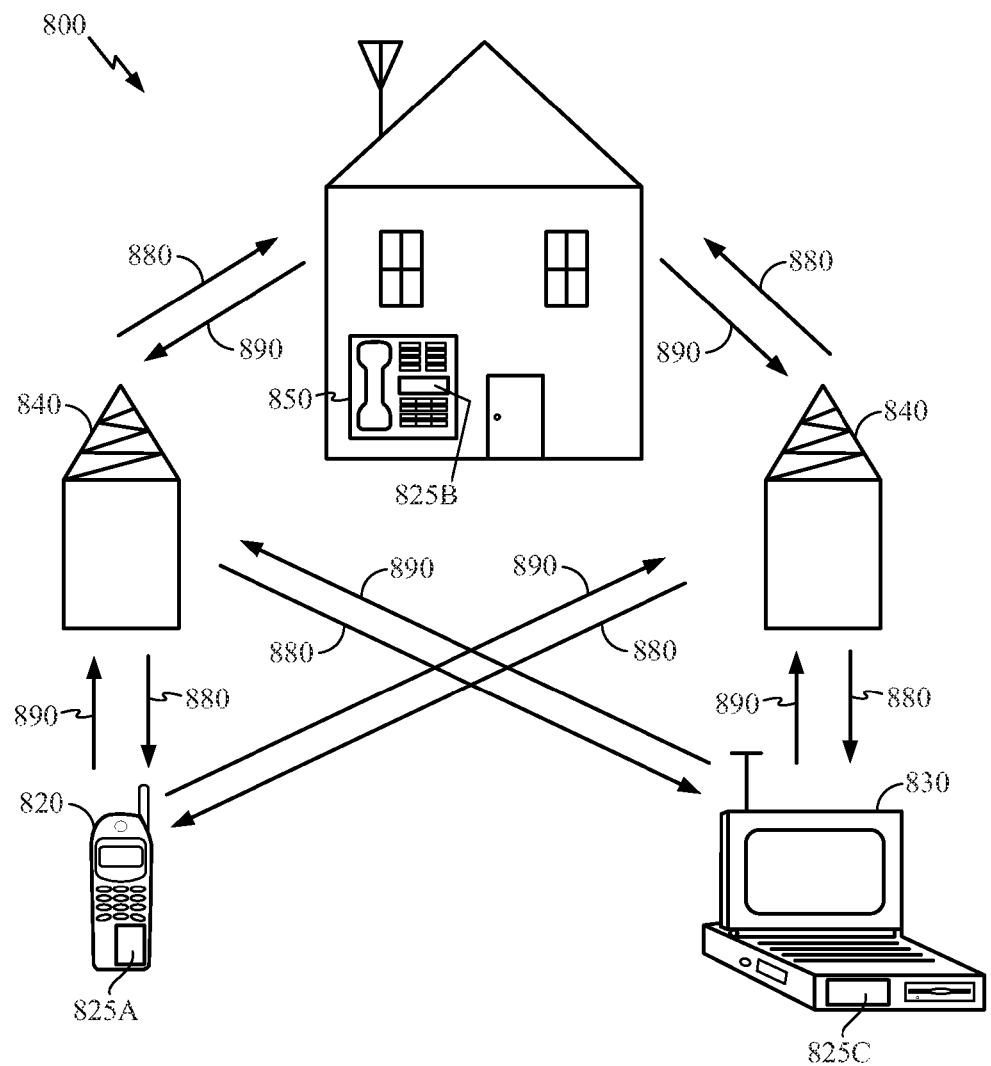
FIG. 8 is a block diagram showing an exemplary wireless communication system in which an embodiment of the disclosure may be advantageously employed.

FIG. 8 is a block diagram showing an exemplary wireless communication system 800 in which an embodiment of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C and 825B that include the disclosed MRAM. It will be recognized that other devices may also include the disclosed MRAM, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 8 illustrates remote units according to the teachings of the disclosure, the disclosure is not limited to these exemplary illustrated units.

Embodiments of the disclosure may be suitably employed in any device which includes MRAM.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A programmable logic circuit, comprising:
a plurality of magnetic tunnel junctions (MTJs) configurable as logic circuitry including a first category of logic gates and a second category of logic gates, the first category of logic gates including OR gates and NAND gates, and the second category of logic gates including AND and NOR gates; and
reference circuitry configurable to select a first reference level for the first category of logic gates and a second reference level for the second category of logic gates.

2. The programmable logic circuit of claim 1, in which the reference circuitry includes four MTJs configured in parallel.

3. The programmable logic circuit of claim 2, further comprising:
a first one of the four MTJs in a state of parallel magnetic orientation;
a second one of the four MTJs in a state of anti-parallel magnetic orientation; and
two reference MTJs of the four MTJs, the two reference MTJs in the same state of magnetic orientation.

4. The programmable logic circuit of claim 1, integrated into at least one of a mobile phone, a set top box, a music player, a video player, an entertainment unit, a navigation device, a computer, a hand-held personal communication systems (PCS) unit, a portable data unit, and a fixed location data unit.

5. The programmable logic circuit of claim 1, in which the reference circuitry includes four MTJs configured in parallel,
in which the first reference level corresponds to three of the four MTJs in a state of parallel magnetic orientation and a fourth one of the four MTJS in a state of anti-parallel magnetic orientation; and
in which the second reference level corresponds to three of the four MTJs in a state of anti-parallel magnetic orientation and a fourth one of the four MTJS in a state of parallel magnetic orientation.

6. A method of magnetic random access memory (MRAM) logic sensing, comprising:
coupling an output node of an MRAM logic gate to a reference node of a reference circuit of the MRAM, the MRAM logic gate in one of at least two categories of logic gates, comprising a first category of logic gates including OR gates and NAND gates, and a second category of logic gates including AND and NOR gates; and
configuring the reference circuit to provide one of at least two reference levels corresponding to the one of at least two categories of logic gates.

7. The method of claim 6, further comprising:
evaluating an output of the MRAM logic gate by comparing an output level of the MRAM logic gate to the one of at least two reference levels.

8. The method of claim 6, further comprising:
integrating the MRAM into at least one of a mobile phone, a set top box, a music player, a video player, an entertainment unit, a navigation device, a computer, a hand-held personal communication systems (PCS) unit, a portable data unit, and a fixed location data unit.

9. The method of claim 6, in which configuring the reference circuitry comprises configuring four MTJs in parallel, in which a first reference level corresponds to three of the four MTJs in a state of parallel magnetic orientation and a fourth one of the four MTJS in a state of anti-parallel magnetic orientation; and in which a second reference level corresponds to three of the four MTJs in a state of anti-parallel magnetic orientation and a fourth one of the four MTJS in a state of parallel magnetic orientation.

10. A method of magnetic random access memory (MRAM) logic sensing, comprising the steps of:

coupling an output node of an MRAM logic gate to a reference node of a reference circuit of the MRAM, the MRAM logic gate in one of at least two categories of logic gates, comprising a first category of logic gates including OR gates and NAND gates, and a second category of logic gates including AND and NOR gates; and configuring the reference circuit to provide one of at least two reference levels corresponding to the one of at least two categories of logic gates.

11. The method of claim 10, further comprising the step of:
evaluating an output of the MRAM logic gate by comparing an output level of the MRAM logic gate to the one of at least two reference levels.

12. The method of claim 10, further comprising the step of:
integrating the MRAM into at least one of a mobile phone, a set top box, a music player, a video player, an entertainment unit, a navigation device, a computer, a hand-held personal communication systems (PCS) unit, a portable data unit, and a fixed location data unit.

13. The method of claim 10, in which configuring the reference circuitry comprises a step of configuring four MTJs in parallel, in which a first reference level corresponds to three of the four MTJs in a state of parallel magnetic orientation and a fourth one of the four MTJS in a state of anti-parallel magnetic orientation; and in which a second reference level corresponds to three of the four MTJs in a state of anti-parallel magnetic orientation and a fourth one of the four MTJS in a state of parallel magnetic orientation.

14. An apparatus for magnetic random access memory (MRAM) logic sensing, comprising:

means for coupling an output node of an MRAM logic gate to a reference node of a reference circuit of the MRAM, the MRAM logic gate in one of at least two categories of logic gates, comprising a first category of topic gates including OR gates and NAND gates, and a second category of logic gates including AND and NOR gates; and means for configuring the reference circuit to provide one of at least two reference levels corresponding to the one of at least two categories of logic gates.

15. The apparatus of claim 14, further comprising:
means for evaluating an output of the MRAM logic gate by comparing an output level of the MRAM logic gate to the one of at least two reference levels.

16. The apparatus of claim 14, further comprising:
means for integrating the MRAM into at least one of a mobile phone, a set top box, a music player, a video player, an entertainment unit, a navigation device, a computer, a hand-held personal communication systems (PCS) unit, a portable data unit, and a fixed location data unit.

17. The apparatus of claim 14, in which the means for configuring the reference circuitry comprises:

means for configuring four reference MTJs in parallel;

means for configuring three of the four reference MTJs in a state of parallel magnetic orientation and a fourth one of the four reference MTJS in a state of anti-parallel magnetic orientation to generate a first reference level; and means for configuring three of the four reference MTJs in a state of anti-parallel magnetic orientation and a fourth one of the four reference MTJS in a state of parallel magnetic orientation to generate a second reference level.

* * * * *